(12) United States Patent
Ogasawara

(10) Patent No.: US 10,488,752 B2
(45) Date of Patent: Nov. 26, 2019

(54) IMPRINT APPARATUS AND ARTICLE MANUFACTURING METHOD

(71) Applicant: CANON KABUSHIKI KAISHA, Tokyo (JP)

(72) Inventor: Masaki Ogasawara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 561 days.

(21) Appl. No.: 14/734,213

(22) Filed: Jun. 9, 2015

(65) Prior Publication Data

US 2015/0352776 A1    Dec. 10, 2015

(30) Foreign Application Priority Data

Jun. 10, 2014 (JP) ................................. 2014-119889

(51) Int. Cl.
*B29C 59/00* (2006.01)
*G03F 7/00* (2006.01)

(52) U.S. Cl.
CPC .................. *G03F 7/0002* (2013.01)

(58) Field of Classification Search
CPC .................................................. G03F 7/0002
USPC .............. 264/293; 425/174.4, 385
See application file for complete search history.

(56) References Cited

U.S. PATENT DOCUMENTS

| | | | | |
|---|---|---|---|---|
| 5,059,266 A | * | 10/1991 | Yamane | B29C 41/08 118/313 |
| 7,854,877 B2 | | 12/2010 | Schram et al. | |
| 8,827,685 B2 | * | 9/2014 | Tsuji | B29C 43/021 264/446 |
| 8,915,730 B2 | * | 12/2014 | Matsui | B29C 64/112 425/375 |
| 2002/0167101 A1 | * | 11/2002 | Tochimoto | B29C 41/36 264/40.1 |
| 2004/0261817 A1 | | 12/2004 | Araki et al. | |
| 2010/0072653 A1 | * | 3/2010 | Kawakami | B29C 43/003 264/134 |
| 2011/0049761 A1 | * | 3/2011 | Mataki | B82Y 10/00 264/293 |
| 2011/0151124 A1 | * | 6/2011 | Ina | B82Y 10/00 427/277 |

(Continued)

FOREIGN PATENT DOCUMENTS

| | | | | |
|---|---|---|---|---|
| JP | 2004103817 A | * | 2/2004 | ........... H01L 21/027 |
| JP | 2005039205 A | | 2/2005 | |

(Continued)

OTHER PUBLICATIONS

Office Action issued in Korean Patent Application No. 10-2015-0081156 dated Mar. 10, 2017.

(Continued)

*Primary Examiner* — Nahida Sultana
(74) *Attorney, Agent, or Firm* — Rossi, Kimms & McDowell LLP

(57) ABSTRACT

An imprint apparatus includes: a dispenser configured to dispense an imprint material to the imprint region; and a controller configured to control the imprint process so that a pattern is formed in a first imprint region, located upstream of a second imprint region with respect to a gas flow between the dispenser and the substrate, earlier than in the second imprint region.

6 Claims, 3 Drawing Sheets

(56) References Cited

U.S. PATENT DOCUMENTS

| | | | |
|---|---|---|---|
| 2011/0309548 A1* | 12/2011 | Aihara | B82Y 10/00 264/293 |
| 2012/0073461 A1* | 3/2012 | Terada | B08B 3/024 101/425 |
| 2012/0080820 A1* | 4/2012 | Narioka | G03F 7/0002 264/293 |
| 2012/0152136 A1* | 6/2012 | Hiroshiro | B29C 37/0053 101/287 |
| 2012/0200005 A1* | 8/2012 | Sato | B82Y 10/00 264/293 |
| 2014/0001675 A1* | 1/2014 | Nakamura | B82Y 10/00 264/293 |
| 2014/0191441 A1* | 7/2014 | Mori | B29C 59/002 264/293 |
| 2014/0210134 A1* | 7/2014 | Wakamatsu | B29C 59/02 264/293 |
| 2015/0258734 A1* | 9/2015 | Okamoto | B29C 67/0059 235/488 |
| 2016/0016354 A1* | 1/2016 | Sakamoto | G03F 7/0002 264/293 |
| 2016/0349634 A1* | 12/2016 | Tanaka | G03F 9/7042 |
| 2017/0165898 A1* | 6/2017 | Meissl | B29C 35/02 |
| 2017/0285467 A1* | 10/2017 | Nakayama | B05D 3/06 |
| 2018/0356741 A1* | 12/2018 | Matsuoka | G03F 7/70925 |

FOREIGN PATENT DOCUMENTS

| | | | | |
|---|---|---|---|---|
| JP | 2009065135 A | | 3/2009 | |
| JP | 2012004354 A | * | 1/2012 | ........... H01L 21/027 |
| JP | 2012190877 A | * | 10/2014 | ........... H01L 21/027 |
| KR | 1020110137731 A | | 12/2011 | |
| TW | 201206687 A1 | | 2/2012 | |

OTHER PUBLICATIONS

Office Action issued in Chinese Application No. 201510312786.5 dated Apr. 11, 2019. English translation provided.

* cited by examiner

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

As the demand for micropatterning of semiconductor devices increases, a microfabrication technique of molding an uncured resin (uncured material) on a substrate using a mold to form a resin pattern on the substrate has received attention, in addition to a conventional photolithography technique. This technique is also called an imprint technique and can form a fine structure in the order of several nm on the substrate. A photocuring method is one example of the imprint technique. In an imprint apparatus which adopts the photocuring method, first, an ultraviolet curing resin (UV curing resin) (to be simply referred to as a "resin" hereinafter) is dispensed to a shot region (imprint region) on the substrate (wafer). For example, an inkjet method or the like is used as a dispensing method. Next, this resin (uncured resin) is molded using the mold. Then, a mold is released after the resin is cured by ultraviolet irradiation, thereby forming the resin pattern on the substrate.

In this imprint apparatus, a pattern is formed (to be referred to as "imprinted" hereinafter) to a plurality of imprint regions in order from an adjacent imprint region first. However, the next adjacent imprint region is influenced by heat or the like from the imprint region where the imprint process has been performed immediately before. There may be a case in which, for example, magnification correction of the next adjacent imprint region cannot be performed accurately because the imprint region where the imprint process has been performed immediately before and its peripheral substrate thermally expand or contract due to the influences of heat of ultraviolet irradiation and the temperature of the mold during a pattern formation process. To solve this, for example, Japanese Patent Laid-Open No. 2009-065135 discloses a method of preventing two imprint regions where the imprint process is performed successively from being adjacent to each other, thereby reducing a thermal influence.

In the imprint apparatus, when dispensing the resin to the imprint region on the substrate by the inkjet method, a part of the resin may become a foggy fine droplet (mist) and be scattered in the adjacent imprint regions. In this case, a pattern defect may occur in the imprint region where the imprint process has been performed before.

SUMMARY OF THE INVENTION

The present invention provides, for example, an imprint apparatus advantageous in reduction of a pattern defect thereby.

The present invention in its one aspect provides an imprint apparatus for performing an imprint process of forming a pattern in an imprint region on a substrate, the apparatus comprising: a dispenser configured to dispense an imprint material to the imprint region; and a controller configured to control the imprint process so that a pattern is formed in a first imprint region, located upstream of a second imprint region with respect to a gas flow between the dispenser and the substrate, earlier than in the second imprint region.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

[First Embodiment]

Figure 1:
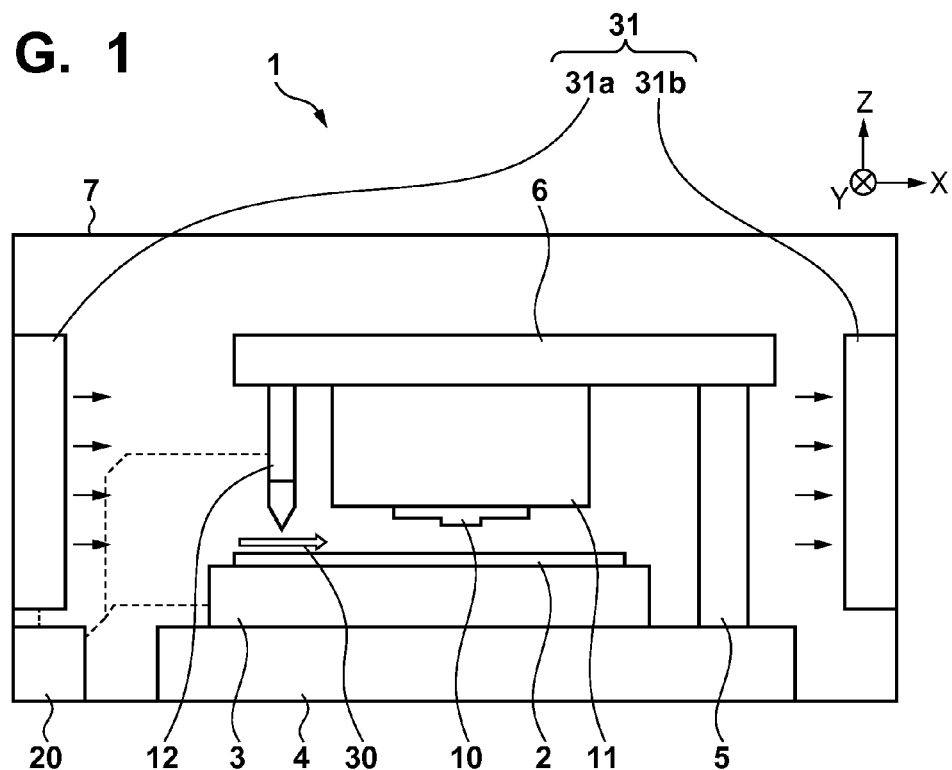
FIG. 1 is a view showing an imprint apparatus according to the first embodiment.

FIG. 1 shows an imprint apparatus according to the first embodiment of the present invention. An imprint apparatus 1 transfers a concavo-convex pattern of a mold 10 onto a substrate (wafer) 2 serving as a target substrate used in a semiconductor device manufacturing process. The imprint apparatus according to the first embodiment adopts a method of curing a resin with light when transferring the concavo-convex pattern of the mold 10. As shown in FIG. 1, an axis parallel to a direction in which the mold 10 is irradiated with ultraviolet rays is set to the Z-axis, and the X-axis and the Y-axis are defined in a direction perpendicular to the Z-axis.

The imprint apparatus 1 includes a substrate stage 3 which holds the substrate 2, a mold holding unit 11 which holds the mold 10, a controller 20, a dispenser 12, and a generator 31 which generates a gas flow 30. The substrate 2 is a substrate to be processed. For example, a single-crystal silicon wafer, an SOI (Silicon on Insulator) wafer, or the like is used for the substrate 2. The dispenser 12 dispenses an imprint material serving as a molding member on the surface of the substrate 2 to be processed. An ultraviolet curing resin can be used as the imprint material. A concavo-convex pattern to be transferred to the imprint material is formed to have a three-dimensional shape on the surface of the mold 10 having a rectangle peripheral portion and facing the substrate 2. A material which transmits ultraviolet rays such as quartz is used for the mold 10.

The mold holding unit 11 holds and fixes the mold 10, and imprints the concavo-convex pattern of the mold 10 onto the substrate 2. The mold holding unit 11 includes a mold holding mechanism, a mold shape correcting mechanism, and a mold stage (all of which are not shown). The mold holding mechanism holds and fixes the mold 10 by a vacuum suction pad. The mold holding mechanism is mechanically held by the mold stage. The mold stage is a driving system configured to position the spacing between the substrate 2 and the mold 10 when transferring the concavo-convex pattern of the mold 10 onto the substrate 2, and is driven in the Z-axis direction. The mold stage is required to perform highly accurate positioning when transferring the three-dimensional pattern. Therefore, the mold stage may be formed by a plurality of driving systems such as a coarse driving system (device) and a fine driving system (device). Furthermore, the mold stage may have a position adjustment function not only in the Z-axis direction but also in the X-axis direction, the Y-axis direction, or the θ direction (rotational direction around the Z-axis), and a tilt function of correcting the tilt of the mold 10. The mold shape correcting mechanism can correct the shape of the mold 10 by applying a force or a deformation to the side surface of the mold 10.

The substrate stage 3 is a driving system which is driven in the X-axis direction and the Y-axis direction to correct (align) the translation shift between the substrate 2 and the mold 10. The driving system of the substrate stage 3 in the X-axis direction and the Y-axis direction may also be formed by the plurality of driving systems such as the coarse driving system and the fine driving system. Furthermore, the substrate stage 3 may have a driving system configured to perform a position adjustment in the Z-axis direction, the position adjustment function in the θ direction (rotational direction around the Z-axis) of the substrate 2, and a tilt function of correcting the tilt of the substrate 2. The substrate stage 3 mechanically holds the substrate 2 by the vacuum suction pad.

The dispenser 12 dispenses the imprint material onto the substrate 2. The dispenser 12 includes a nozzle (not shown) which dispenses the imprint material and dispenses the imprint material from the nozzle onto the substrate 2. It is known that when the dispenser 12 dispenses the imprint material, a droplet to land on the substrate 2 and a foggy fine droplet (mist) separated from the droplet are generated from the dispensed imprint material. The dispensing amount of the imprint material can be determined based on, for example, the thickness of the necessary imprint material or the density of the pattern to be transferred. A dispensing destination region is a shot region (imprint region) serving as a target of the imprint process immediately after dispensing. The controller 20 controls the operation, the adjustment, and the like of each component of the imprint apparatus 1. In the first embodiment, the controller 20 specifically controls dispensing of the imprint material by the dispenser 12 and driving of the substrate stage 3.

A clean chamber 7 stores the imprint apparatus 1. The clean chamber 7 includes the generator 31 which generates the gas flow 30, a chemical filter (not shown), and a particle filter (not shown). A fan (supply device) 31a draws in air in an atmosphere where the clean chamber 7 is placed, a chemical substance and dust slightly contained in the drawn air are removed with the chemical filter and the particle filter, and then clean air is supplied from an air blowing port (not shown) to a space inside the clean chamber 7.

The generator 31 generates the gas flow 30 inside the imprint apparatus 1 in order to exhaust heat, dust, and the like generated from the imprint apparatus 1. The generator 31 may aim to generate the gas flow 30 between the dispenser 12 and the substrate stage 3. The generator 31 can include a recovery device (vacuum generation mechanism) 31b which recovers a gas and the supply device (fan) 31a which supplies the gas. A vacuum pump can be used as the vacuum generation mechanism 31b. The vacuum generation mechanism 31b may be arranged inside the clean chamber 7. If the vacuum generation mechanism 31b is arranged outside the clean chamber 7, an exhaust port can be arranged inside the clean chamber 7 and connected to the vacuum generation mechanism 31b arranged outside the clean chamber 7 using a duct or the like. Note that the arrangement position of the vacuum generation mechanism 31b is not limited to a position shown in FIG. 1, but may be arranged between the dispenser 12 and the mold 10. The gas flow 30 does not change its direction but can be fixed in a predetermined direction so as not to prevent the imprint material dispensed from the dispenser 12 from being uniformly dispensed onto the substrate 2.

Additionally, the imprint apparatus 1 includes a substrate conveying unit (device) configured to convey the substrate 2 onto the substrate stage 3, a mold conveying unit configured to convey the mold 10 to the mold holding unit 11, and an irradiation unit (device) configured to irradiate the mold 10 with the ultraviolet rays in the imprint process. The imprint apparatus 1 also includes a base surface plate 4 configured to hold the substrate stage 3, a bridge surface plate 6 configured to hold the mold holding unit 11, and a column 5 configured to support the bridge surface plate 6.

Figure 2:
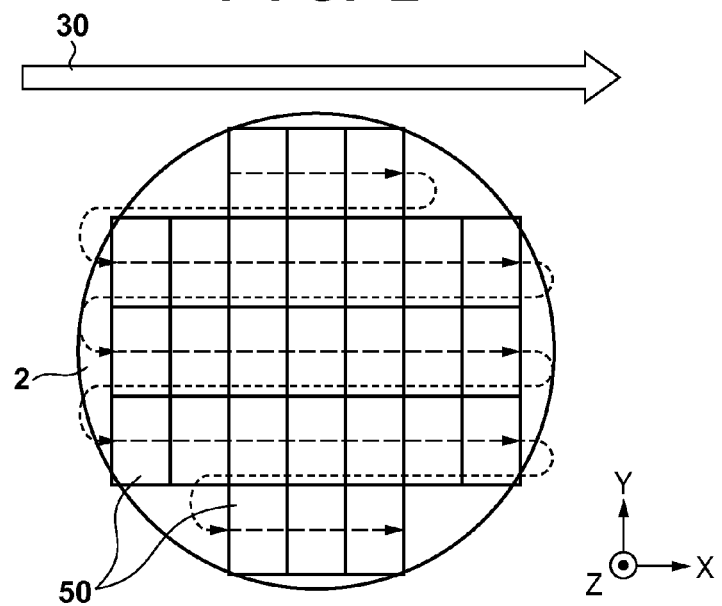
FIG. 2 is a view showing imprint regions and the order of an imprint process.

A imprint method according to the first embodiment will now be described with reference to FIG. 2. FIG. 2 shows the order of performing, by the imprint apparatus 1 shown in FIG. 1, the imprint process on the plurality of imprint regions arranged on the substrate 2. As shown in FIG. 2, the axis perpendicular to the surface of the substrate 2 is defined as the Z-axis, and axes parallel to the surface of the substrate 2 are defined as the X-axis and the Y-axis. Each imprint region 50 represents a unit region where the imprint material is dispensed onto the substrate 2 and the mold 10 is brought into contact with the dispensed imprint material, thereby performing the imprint process of forming the pattern. As shown in FIG. 2, the imprint regions 50 are regularly arranged on a plurality of rows and a plurality of columns on the substrate 2. In the first embodiment, the imprint regions are arranged on the plurality of rows and the plurality of arrays on the substrate 2. However, the imprint regions may only be arranged in the direction of the plurality of rows.

The gas flow 30 is oriented in the X-axis direction, as indicated by an arrow. Assume that in FIG. 2, the upstream (weather side) of the gas flow 30 is on the left side and the downstream (lee side) is on the right side. According to the first embodiment, the imprint process is performed for each row. That is, patterns are formed sequentially in the plurality of imprint regions belonging to one row and arranged along the gas flow 30. In the plurality of imprint regions on each row, the imprint process is performed in order from the imprint region on the weather side (left side of FIG. 2) of the gas flow 30 to the imprint region on the lee side (right side of FIG. 2), and sequentially in the X-axis direction, as shown by the same broken-line arrow. Once the imprint region on the most lee side (rightmost side of FIG. 2) on the same row is reached to complete the imprint process, the row is changed in the Y-axis direction, and the imprint process is sequentially performed again on the plurality of imprint regions on the changed row from the weather side (left side of FIG. 2) to the lee side (right side of FIG. 2). The aforementioned controller 20 shown in FIG. 1 determines this order of the imprint process based on information about the direction of the gas flow 30.

[Second Embodiment]

Figure 3:
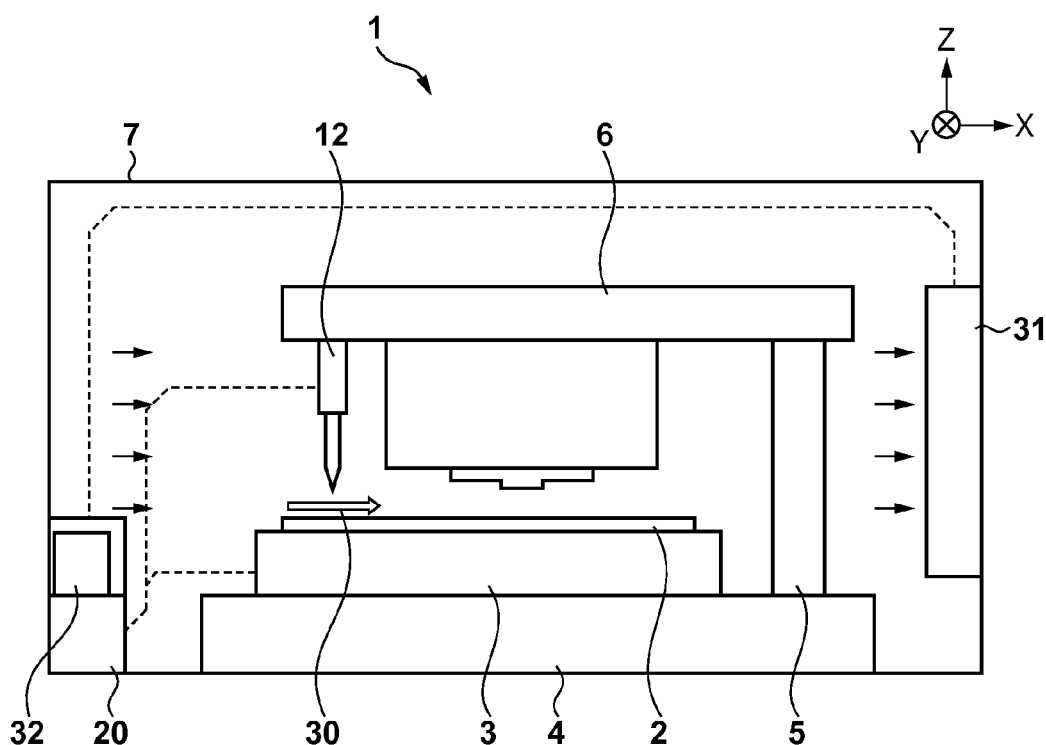
FIG. 3 is a view showing an imprint apparatus according to the second embodiment.
Figure 4A:
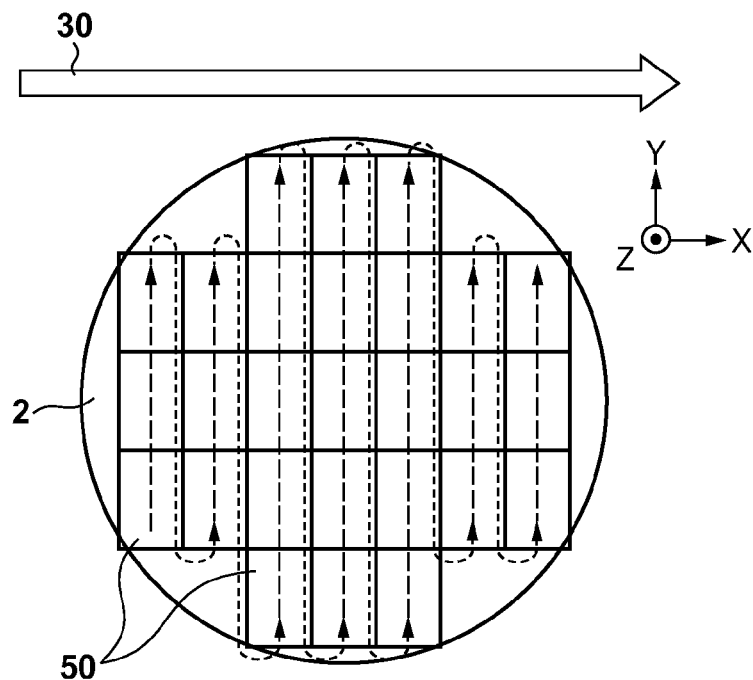
FIGS. 4A and 4B are views showing imprint regions and the order of an imprint process according to the third embodiment.
Figure 4B:
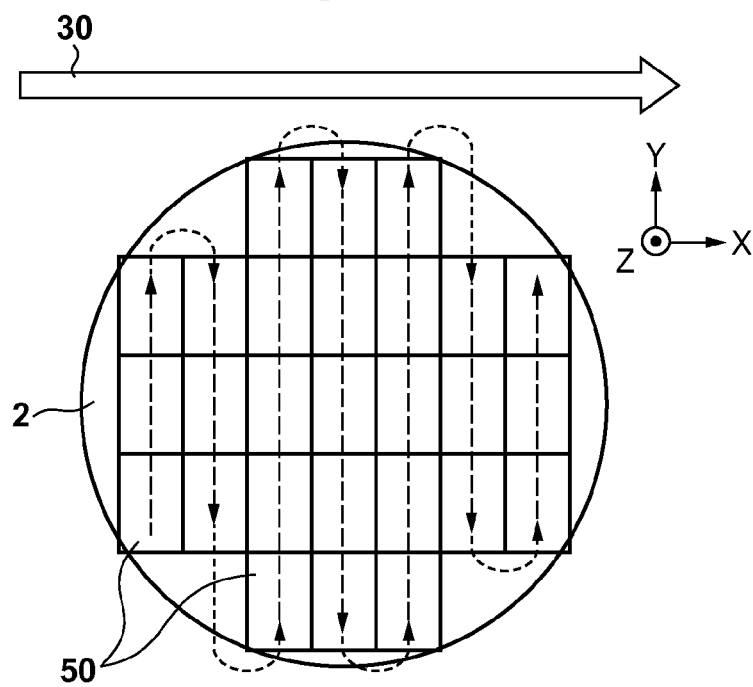

An imprint apparatus 1 according to the second embodiment of the present invention will now be described with reference to FIG. 3. In FIG. 3, a description on similar portions to those in FIG. 1 will be omitted. A controller 20 in the imprint apparatus 1 according to the second embodiment includes a gas-flow speed controller 32 which controls the speed change in a gas flow 30 generated by a generator 31. The gas-flow speed controller 32 outputs a command value for determining the speed of the gas flow 30 to a change mechanism (not shown) in the generator 31 capable of changing the speed of the gas flow 30. The change mechanism can use a butterfly valve which blocks the flow of the gas flow 30, a pulse motor configured to control the degree of opening of the butterfly valve, and the like. Alternatively, if a fan is used as the generator 31, the change mechanism may use, for example, an inverter configured to change the rotation speed of the fan.

The overspeed of the gas flow 30 generated by the generator 31 poses a problem. That is, if the speed of the gas flow 30 is too high, even a droplet is flowed greatly into the gas flow 30 together with the mist of an imprint material dispensed from a dispenser 12, making it difficult to land the droplet in an intended portion on a substrate 2 and making it impossible to achieve uniform dispensing. As a result, accurate pattern formation may be impeded in the imprint apparatus 1.

According to the second embodiment, the gas-flow speed controller 32 controls the speed of the gas flow 30, thereby making it possible to inhibit the droplet of the imprint material from being flowed into the gas flow 30 as much as possible and adjust a range where the mist of the imprint material is scattered. The range where the mist is scattered can be limited to the imprint region of an imprint-process target and its adjacent imprint region on the lee side. The speed of the gas flow 30 can be adjusted and changed as needed based on, for example, the amount of the imprint material dropped when dispensing, uniformity when dispensing the imprint material onto the substrate 2, and the scattering distance of the mist of the imprint material in the lee-side direction of the gas flow 30, all of which are defined in a recipe.

[Third Embodiment]

An imprint method according to the third embodiment of the present invention will now be described with reference to FIGS. 4A and 4B. FIGS. 4A and 4B show the order of performing an imprint process on a plurality of imprint regions on a substrate 2. The order in FIGS. 4A and 4B is changed from that shown in FIG. 2. In the first embodiment shown in FIG. 2, the imprint process is performed for each row in the direction of the gas flow 30 and in the plurality of imprint regions on one row, the imprint process is performed in order from the imprint region on the weather side to the imprint region on the lee side. On the other hand, in the third embodiment, the imprint process is performed for each column in the imprint regions in the direction (Y direction) perpendicular to the direction of a gas flow 30, as shown in FIGS. 4A and 4B. In the third embodiment, the imprint process is performed in order, out of the plurality of columns, from the column on the weather side to the column on the lee side. The advancing direction of the plurality of imprint regions arranged in the Y direction on one column may always be the same direction (for example, the + direction) along the Y-axis, as shown in FIG. 4A. Alternatively, the advancing direction of the imprint regions where patterns are formed sequentially may be opposite to each other between two adjacent columns, as shown in FIG. 4B. The mist of the imprint material generated when dispensing the imprint material to the imprint regions where the imprint process is performed is scattered in the imprint region where the imprint process has not been performed, but is not scattered in the imprint region where the imprint process has already been performed. It is therefore possible to prevent pattern defect occurrence owing to adhesion of the mist to the pattern formed after performing the imprint process.

[Other Embodiments]

In the first to the third embodiments, the direction of the gas flow 30 is not changed but fixed. However, the direction of a gas flow 30 may be changed. In this case, however, a controller 20 needs to change the order of an imprint process in accordance with the change in the direction of the gas flow 30. The controller 20 can also change the direction of the gas flow 30 in accordance with changing the order of imprint regions where the imprint process is performed.

[Article Manufacturing Method]

An article manufacturing method according to an embodiment of the present invention is suitable for manufacturing an article, for example, a microdevice such as a semiconductor device or an element having a microstructure. The manufacturing method includes a step of forming a pattern on a substrate using an imprint apparatus 1. This manufacturing method can further include other known steps (oxidation, deposition, vapor deposition, doping, planarization, etching, resist peeling, dicing, bonding, packaging, and the like) of processing the substrate on which the pattern has been formed. The article manufacturing method according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-119889, filed Jun. 10, 2014, which is hereby incorporated by reference herein in its entirety.

What is claimed is:

1. An imprint apparatus for forming a pattern of an imprint material in each of a plurality of imprint regions on a substrate using a mold, the apparatus comprising:

a dispenser configured to dispense the imprint material to each of the plurality of imprint regions;

a generator configured to generate a gas flow between the dispenser and the substrate; and a controller, wherein the controller is configured to cause the apparatus to (a) dispense, by the dispenser, imprint material onto one or more first imprint regions adjacent to each other, of the plurality of imprint regions, (b) form the pattern of the imprint material dispensed on the one or more first imprint regions, (c) dispense the imprint material on to one or more second imprint regions adjacent to each other, of the plurality of imprint regions, located downstream of the one or more first imprint regions with respect to the gas flow between the dispenser and the substrate and adjacent to the one or more first imprint regions, and (d) form the pattern of the imprint material dispensed on the one or more second imprint regions, wherein the pattern is formed sequentially in each of the plurality of imprint regions on the substrate arranged along the gas flow, and wherein dispensing of the imprint material by the dispenser is performed in each of a plurality of upstream side imprint regions belonging a first column located upstream with respect to the gas flow, earlier than forming of the pattern in each of a plurality of downstream side imprint regions belonging to a second column located downstream side of the upstream side imprint regions with respect to the gas flow.

2. The apparatus according to claim 1, wherein advancing directions of dispensing order of the imprint regions are opposite to each other between the first and second columns adjacent to each other.

3. The apparatus according to claim 1,
wherein the generator is configured to change a direction of the gas flow with respect to each row including a plurality of imprint regions for each of which the pattern is formed sequentially.

4. The apparatus according to claim 1,
wherein the generator includes a supply device configured to supply a gas associated with the gas flow.

5. The apparatus according to claim 1,
wherein the generator includes a recovery device configured to recover a gas associated with the gas flow.

6. An imprint apparatus for forming a pattern of an imprint material in each of a plurality of imprint regions on a substrate using a mold, the apparatus comprising:
a dispenser configured to dispense the imprint material to each of the plurality of imprint regions;
a generator configured to generate a gas flow between the dispenser and the substrate; and
a controller,
wherein the controller is configured to cause the apparatus to (a) dispense, by the dispenser, imprint material onto one or more first imprint regions adjacent to each other, of the plurality of imprint regions, (b) form the pattern of the imprint material dispensed on the one or more first imprint regions, (c) dispense the imprint material on to one or more second imprint regions adjacent to each other, of the plurality of imprint regions, located downstream of the one or more first imprint regions with respect to the gas flow between the dispenser and the substrate and adjacent to the one or more first imprint regions, and (d) form the pattern of the imprint material dispensed on the one or more second imprint regions, and
wherein the controller is configured to control the generator so that a rate of the gas flow is changed based on a recipe for forming the pattern.

* * * * *